US010128042B2

(12) United States Patent
Chen et al.

(10) Patent No.: US 10,128,042 B2
(45) Date of Patent: Nov. 13, 2018

(54) FULL-AUTOMATIC NETWORK TRANSFORMER WINDING MACHINE

(71) Applicant: Zhuhai Hengnuo Science and Technology Co., Ltd., Zhuhai, Guangdong (CN)

(72) Inventors: Xinyu Chen, Guangdong (CN); Dongya Ji, Henan (CN); Jinhui Wu, Guangdong (CN)

(73) Assignee: Zhuhai Hengnuo Science and Technology Co., Ltd., Zhuhai (CN)

( * ) Notice: Subject to any disclaimer, the term of this patent is extended or adjusted under 35 U.S.C. 154(b) by 443 days.

(21) Appl. No.: 15/131,050

(22) Filed: Apr. 18, 2016

(65) Prior Publication Data

US 2016/0307698 A1 Oct. 20, 2016

(30) Foreign Application Priority Data

Apr. 16, 2015 (CN) .......................... 2015 1 0182353

(51) Int. Cl.

*B23P 19/00* (2006.01)
*H05K 13/04* (2006.01)
*H01F 41/08* (2006.01)
*H01F 41/06* (2016.01)

(52) U.S. Cl.

CPC ............. *H01F 41/08* (2013.01); *H01F 41/06* (2013.01)

(58) Field of Classification Search

CPC ................................ H01F 41/06; H01F 41/08
See application file for complete search history.

(56) References Cited

U.S. PATENT DOCUMENTS 4,302,716 A * 11/1981 Glavitsch .............. H02J 3/1864 323/217
2004/0211236 A1* 10/2004 Yamaguchi ............... B21F 3/02 72/137

* cited by examiner

*Primary Examiner* — Paul D Kim

(57) ABSTRACT

The invention provides a full-automatic network transformer winding machine, comprising a T1 ring winding device and a T2 ring winding device connected with said T1 ring winding device, wherein said T1 ring winding device includes an enameled wire pre-cutting mechanism, a stranding mechanism before T1 ring winding, a T1 ring winding mechanism and a tail wire-cutting mechanism which are connected with one another sequentially, and said T2 ring winding device includes a separating mechanism, a stranding mechanism before T2 ring winding and a T2 ring winding mechanism which are connected with one another sequentially. The full-automatic network transformer winding machine of the invention can completely replace manual winding to manufacture the network transformer, has high production efficiency and high product acceptability, and meanwhile provides great convenience to automatically realize shell mounting and end wrapping in subsequent processes.

7 Claims, 8 Drawing Sheets

FULL-AUTOMATIC NETWORK TRANSFORMER WINDING MACHINE

CROSS-REFERENCE TO RELATED APPLICATIONS

The present application claims the benefit of Chinese Patent Application No. 201510182353.2 filed on Apr. 16, 2015, the contents of which are hereby incorporated by reference.

TECHNICAL FIELD

The invention relates to a network transformer winding machine, in particular to a full-automatic network transformer winding machine.

BACKGROUND

Network is present everywhere in the world today, and the network transformer serves as the main electronic element of network equipment. However, production of the network transformer was still in a total manual status in the past, and the manual production process includes T1 ring manually winding; T1 ring manually tapping and stranding; T2 ring fixing on a special clamp and T2 ring manually winding.

With advance in technology, winding of T1 ring can be automatically realized by a machine already. However, because it needs to strand after tapping of wire wound on T1 ring prior to winding of T2 ring, the process before winding of T2 ring is complex. At present manufacture of the network transformer often needs to complete winding of T1 ring by a machine first, and then perform manual winding of T2 ring.

Both methods above have a higher process cost but a lower efficiency, and it is also difficult to ensure the product quality.

SUMMARY OF THE INVENTION

In order to address disadvantages of the prior art, the invention provides a full-automatic network transformer winding machine, including a T1 ring winding device and a T2 ring winding device connected with said T1 ring winding device, wherein said T1 ring winding device includes an enameled wire pre-cutting mechanism, a stranding mechanism before T1 ring winding, a T1 ring winding mechanism and a tail wire-cutting mechanism which are connected with one another sequentially, and said T2 ring winding device includes a separating mechanism, a stranding mechanism before T2 ring winding and a T2 ring winding mechanism which are connected with one another sequentially.

Further, said enameled wire pre-cutting mechanism includes a base, multiple pre-cutting devices arranged at different positions on said base, wherein said pre-cutting devices are used for pre-cutting a part of the enameled wire.

Further, said tail wire-cutting mechanism includes a rack, a wire tail pressing assembly, a magnetic ring driving assembly and a magnetic ring clamping assembly mounted on the rack.

Further, said separating mechanism includes a guide rail, a T1 ring feeding assembly mounted on the guide rail and a separating assembly, and said separating assembly is mounted on said T1 ring feeding assembly.

Further, said stranding mechanism before T2 ring winding includes a wire head clamping assembly, a wire tail clamping assembly, a T1 ring clamping assembly and a stranding assembly, wherein said T1 ring clamping assembly is located between the wire tail clamping assembly and the wire head clamping assembly, and said stranding assembly is arranged above the wire head clamping assembly.

Further, the winding machine further includes a feeding mechanism, wherein said feeding mechanism includes a T1 coil feeding rack, a transmission device, a T1 coil feeding and lifting device, a left wire clamping and forward-backward moving device, a right wire clamping and forward-backward moving device and a T2 ring feeding device, wherein said T2 ring feeding device includes a T2 ring drawing and lifting device and a T2 ring separation device.

Further, said T2 ring winding mechanism includes a winding assembly, a crochet hook lifting assembly and an enameled wire movement track assembly connected with said winding assembly, a T2 ring clamping mechanism connected with said enameled wire movement track assembly and a T2 ring wire arranging assembly connected with said T2 ring clamping mechanism.

Beneficial effects of the invention are that the full-automatic network transformer winding machine of the invention can completely replace manual winding to manufacture the network transformer, has high production efficiency and high product acceptability, and meanwhile provides great convenience to automatically realize shell mounting and end wrapping in subsequent processes.

DETAILED DESCRIPTION OF THE PREFERRED EMBODIMENT

In order to make objectives, technical schemes and advantages of the invention clearer, the invention will be further illustrated in detail below in conjunction with drawings and examples. It should be understood that specific examples described here is only for the purpose of explaining the invention and not limiting the invention.

Figure 1:
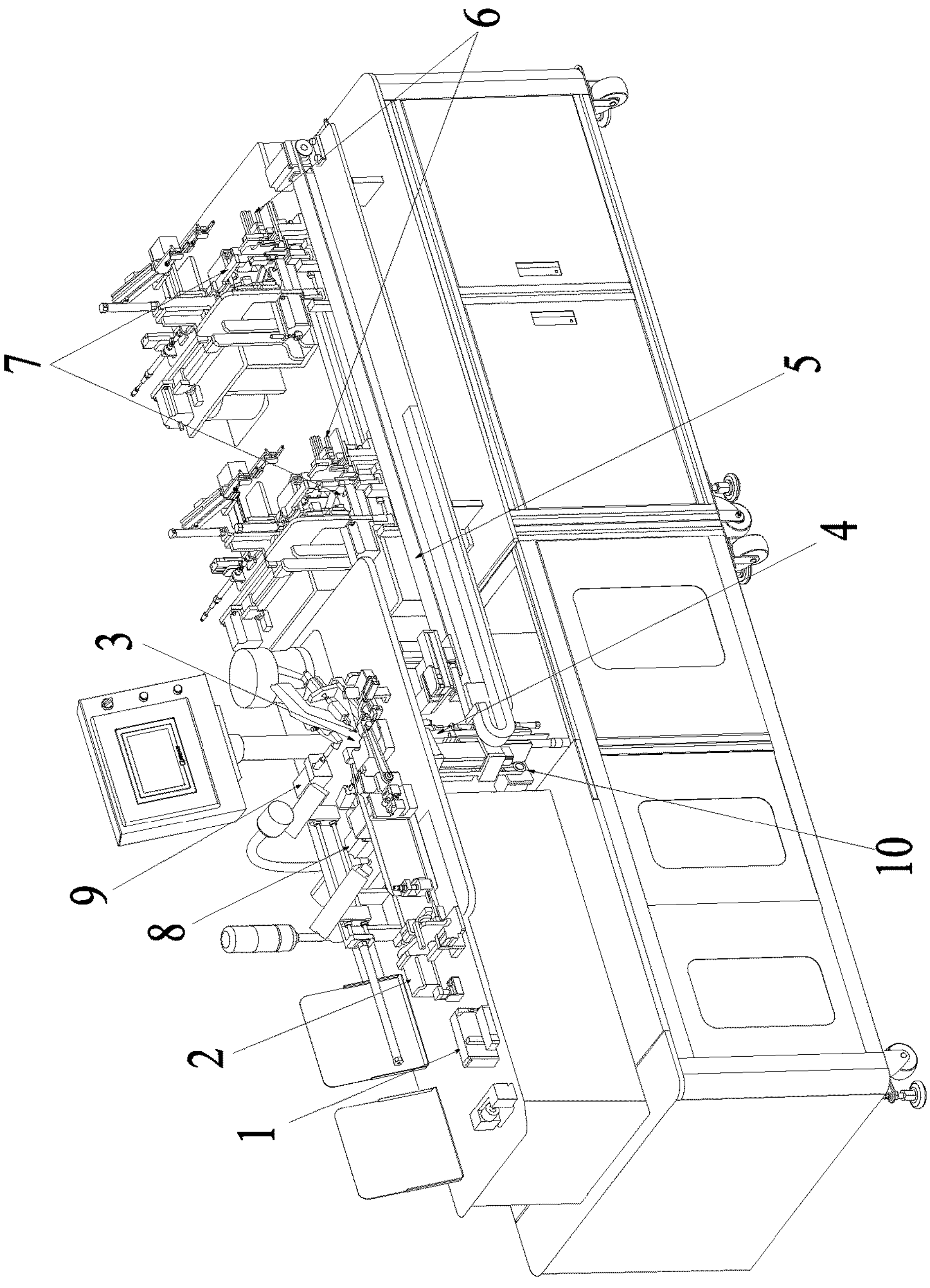
FIG. 1 is an overall structural representation of a full-automatic network transformer winding machine of the invention.

Referring to FIG. 1, a full-automatic network transformer winding machine of the invention includes a T1 ring winding device with long and short tail wires and a T2 ring winding device connected with said T1 ring winding device with long and short tail wires, wherein said T1 ring winding device with long and short tail wires includes an enameled wire pre-cutting mechanism 1 for pre-cutting the enameled wire, a stranding mechanism before T1 ring winding 2 for stranding both ends of the enameled wire into stranded wire in opposite directions, a T1 ring winding mechanism 3 for T1 ring winding and a tail wire-cutting mechanism 4 for cutting the tail wire of T1 ring, which are connected with one another sequentially; said T2 ring winding device includes a separating mechanism 5 for separating two longest tail wires wound on T1 ring by T1 ring winding device 3 with long and short tail wires, a stranding mechanism before T2 ring winding 6 for stranding the two enameled wires separated by said separating mechanism 5 into stranded wires and a T2 ring winding mechanism 7 for winding the stranded enameled wire stranded by said stranding mechanism before T2 ring winding 6 onto T2 ring, which are connected with one another sequentially.

Figure 2:
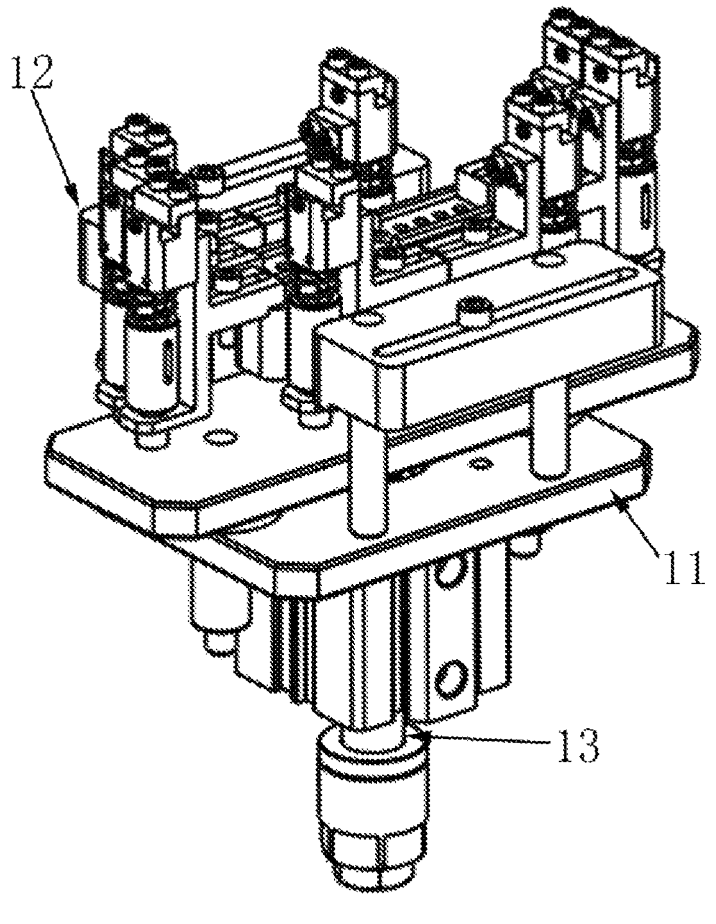
FIG. 2 is a structural representation of an enameled wire pre-cutting mechanism of the full-automatic network transformer winding machine in FIG. 1.

Referring to FIG. 2, the enameled wire pre-cutting mechanism 1 of said full-automatic T1 ring winding machine with long and short tail wires includes a base 11, multiple pre-cutting devices 12 arranged on said base 11 and a cylinder 13 below the base 11 connected with said pre-cutting device 12, said pre-cutting devices 12 are used for pre-cutting a part of the enameled wire in its diameter direction, or changing cross-section shape and size of the enameled wire to realize the objective of pre-cutting, and the pre-cutting position of each enameled wire is different such that head and tail wires of the enameled wire wound on T1 ring are different in length.

Figure 3:
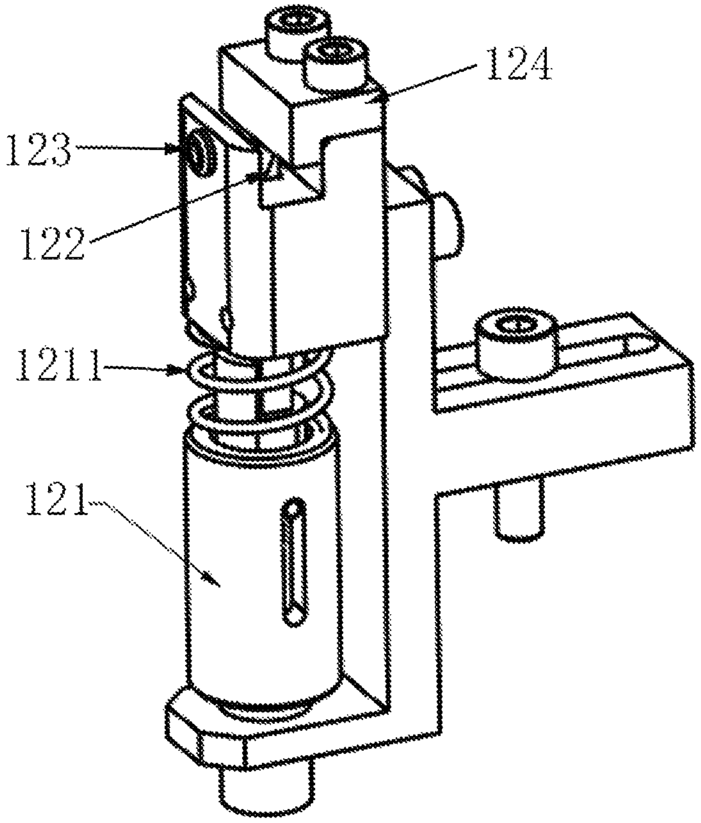
FIG. 3 is a structural representation of a pre-cutting device of the enameled wire pre-cutting mechanism in FIG. 2.

Referring to FIG. 3, said pre-cutting device 12 includes a cutter transmission mechanism 121 for connecting said cylinder 13, and a cutter 122 connected with said cutter transmission mechanism 121, said cutter transmission mechanism 121 has a step-like head for limiting stroke of the cutter to control pre-cutting amount.

Said cutter transmission mechanism 121 includes a transmission rod, a spring arranged within said cutter transmission mechanism and a compressed spring 1211 arranged on said transmission rod, said spring is arranged below said transmission rod, said spring and compressed spring 1211 are used to buffer the pre-cutting force of the pre-cutting assembly, and said transmission rod is used to connect said cutter 122. Among said multiple re-cutting devices 12, the distance between the pre-cutting devices can be adjusted.

Said pre-cutting device 12 further includes a cutter fixing block 125 with a through-hole in the middle to contain said cutter 122, the upper part of the cutter fixing block 125 is "U" shape, and opposite portions on both sides of the "U" shape are mounted with a ceramic eyelet 123 penetrating the "U"-shaped wall, and a height limiting block 124 is mounted on the "U" shape of the cutter fixing block.

Further, said height limiting block 124 is fixed on the "U" shape of the cutter fixing block 125 through hexagon socket head cap screws, and its position makes the cutter 122 cut off a part of the enameled wire in its diameter direction.

The enameled wire goes through two ceramic eyelets 123 arranged opposite, the cylinder 13 drives the cutter transmission mechanism 121 upwards, the cutter transmission mechanism 121 drives the cutter 122 upwards, and the height limiting block 124 limits cutting depth of the cutter 122 such that a part of the enameled wire is cut off in its diameter direction.

Figure 4:
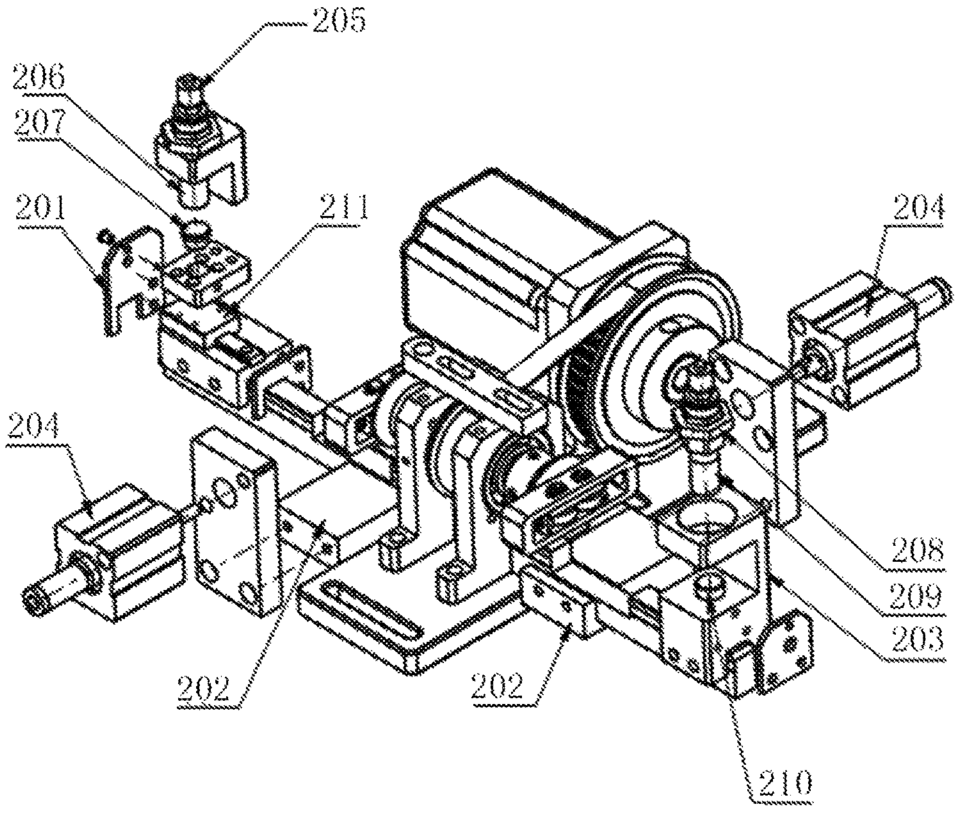
FIG. 4 is a structural representation of a stranding mechanism before T1 ring winding of the full-automatic network transformer winding machine in FIG. 1.

Referring to FIG. 4, a step motor 201 of said stranding mechanism before T1 ring winding 2 drives two wire twisting rotators 202 to rotate by a synchronizing wheel and a synchronizing belt, and the enameled wire is clamped in the middle of the polyurethane bearing 203. Before stranding, the cylinder 204 is reset, and the polyurethane bearing on the wire twisting rotator 202 presses the enameled wire tightly under the action of spring force. The first acicular cylinder 205 is pressed down, the first wire pressing head 206 and the pressing ring 207 press the enameled wire tightly, the second acicular cylinder 208 acts, and the second wire pressing head 209 and the wire supporting post 210 press the enameled wire tightly. When the step motor 201 rotates, the wire between the polyurethane bearing and the wire pressing head 206 of the left rotating head is twisted into a stranded wire, and the wire between the polyurethane bearing and the wire pressing head 209 of the right rotating head is twisted into a reverse stranded wire. In order to prevent the enameled wire from being elongated when stranding, a first straight guide rail 211 and a spring are mounted on the bracket of the acicular cylinder, and with increase of number of turns of stranded wire, the enameled wire become short, and the tension force of the enameled wire overcomes the spring force to pull the first acicular cylinder 205 and the mounting block below to the right. After stranding, the first acicular cylinder 205 and the second acicular cylinder 208 are reset, and the first acicular cylinder 205 and the mounting block below are pulled back to the left under the action of spring force. After stranding, the enameled wire is forward fed to the right, the cylinder

204 props up the wire stranding head, and the polyurethane bearing on the wire twisting rotator 202 opens to release the enameled wire.

Figure 5:
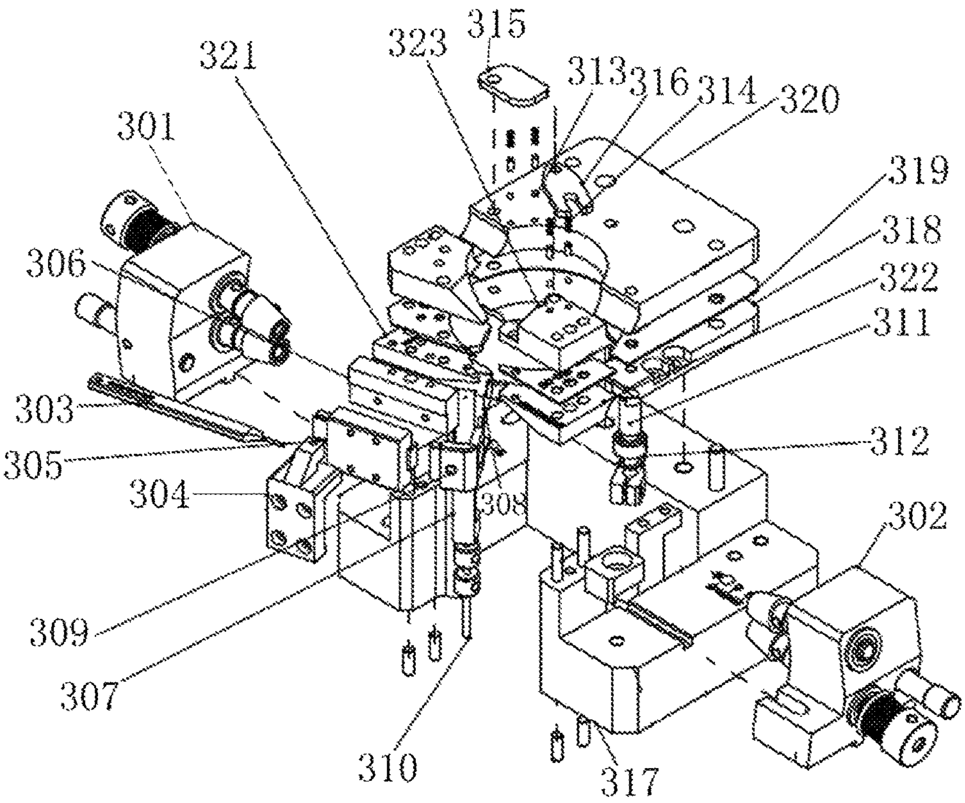
FIG. 5 is a structural representation of a T1 ring winding mechanism of the full-automatic network transformer winding machine in FIG. 1.

Referring to FIG. 5, T1 ring winding mechanism 3 mainly includes a front inclined reel seat 301, a rear inclined reel seat 302, a wire guide pin 303, a wire guide pin mounting block 304, a second straight guide rail 305, a wire guide pin locking block 306, a cutter 307, a wire outlet cutter seat 308, a cutter protection block 309, a cutter connecting rod 310, a wire outlet opening 311, a wire outlet opening rotating and pulling block 312, a steel ball 313, a spring 314, a pressing plate 315, an optical fiber mounting block 316, a storage reel base 317, a semicircle block of storage reel 318, a winding spacer 319, a semicircle cover of storage reel 320, a front block of storage reel 321, a rear block of storage reel 322, a rear cover of storage reel 323 and a cover of storage reel. While the wire feeding assembly transports the stranded wire, the winding transmission assembly drives the front and rear inclined gears to rotate to complete wire storage; when winding, the winding transmission assembly drives the front and rear inclined gears to rotate, the enameled wire in the storage reel goes through the magnetic ring fixed on the magnetic ring feeding assembly, and is wound on T1 magnetic ring with the guide of the wire guide pin 303, the winding spacer 319 and the steel ball 313, and with every turn wound, the wire arranging assembly drives T1 magnetic ring to rotate a given wire arranging angle. After winding a given number of turns, the wire outlet opening 311 opens, the wire head goes out from the wire outlet opening, and after the reclaiming manipulator takes the wound product away, the wire outlet opening is reset and turns to wind the next product.

Figure 6:
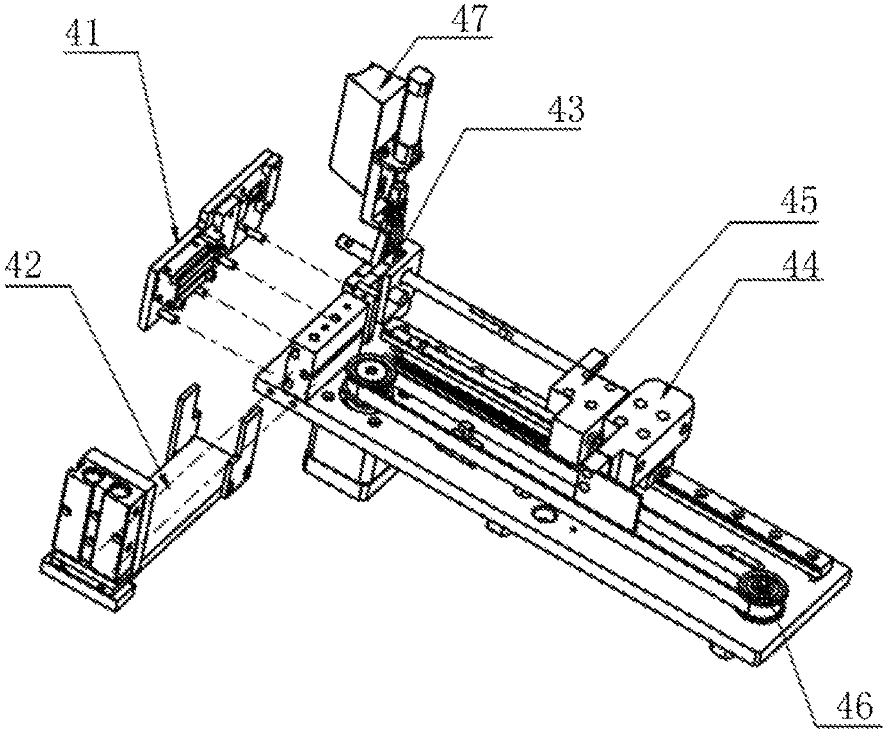
FIG. 6 is a structural representation of a tail wire-cutting mechanism of the full-automatic network transformer winding machine in FIG. 1.

Referring to FIG. 6, the tail wire-cutting mechanism 4 of said full-automatic T1 ring winding machine with long and short tail wires includes a rack, a wire tail pressing assembly 41, a magnetic ring driving assembly 44 and a magnetic ring clamping assembly 45 mounted on the rack. The tail wire-cutting mechanism 4 also includes a parallel pressing assembly 43 connected with said wire tail pressing assembly 41, and a transmission mechanism assembly 46 respectively connected with said magnetic ring driving assembly 44 and said magnetic ring clamping assembly 45.

The tail wire-cutting mechanism 4 of said winding machine also includes a vertical pressing assembly 42, and said vertical pressing assembly 42 is arranged between said wire tail pressing assembly 41 and said magnetic ring clamping assembly 45, and used to ensure that all products clamped by the wire separating manipulator in follow-up processes are at the same position on the clamping jaw of said wire separating manipulator.

Further, the tail wire-cutting mechanism 4 of said winding machine also includes a scrap wire pickup assembly 47, and said scrap wire pickup assembly 47 is arranged below said vertical pressing assembly 42, and used to take excessive stranded wire heads out of the tail wire-cutting mechanism 4 of the winding machine.

Figure 7:
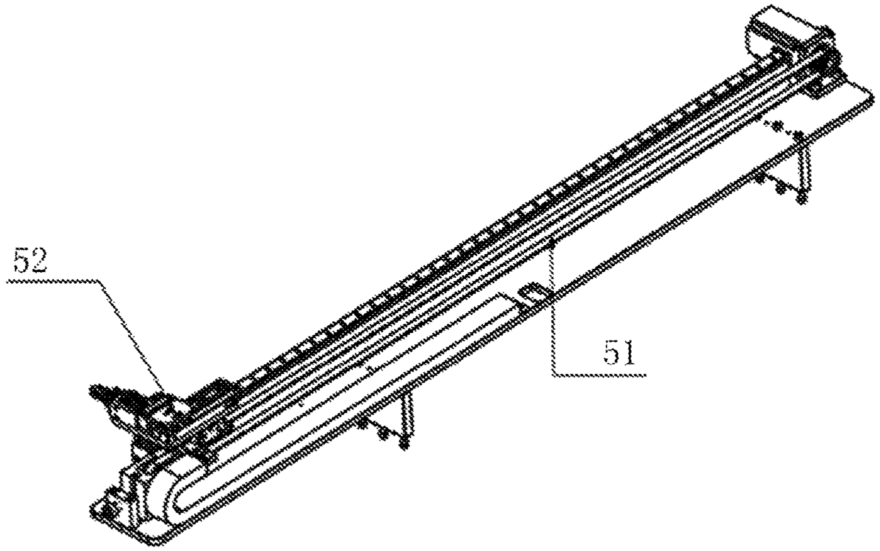
FIG. 7 is a structural representation of a separating mechanism of the full-automatic network transformer winding machine in FIG. 1.

Referring to FIG. 7, said separating mechanism 5 includes a guide rail and a T1 ring feeding assembly 51 mounted on said guide rail and a separating assembly 52, said separating assembly 52 is mounted on said T1 ring feeding assembly 51, wherein said separating assembly 52 is used for separating two longest tail wires from the long and short tail wires of T1 ring with wire wound, and said T1 ring feeding assembly 51 is used for feeding T1 with wire wound and two longest tail wires separated to the next service position.

Wherein said T1 ring feeding assembly 51 includes a bottom plate, a servo motor mounted on one end of said bottom plate, a slider cylinder mounted on the other end of said bottom plate, a first synchronizing wheel mounted on said servo motor, a second synchronizing wheel connected with said first synchronizing wheel through a synchronizing belt, a drag chain mounted on said synchronizing belt, a straight guide rail for mounting said slider cylinder, a photoelectric element mounted on one end of said straight guide rail and a sensing block mounted on said synchronizing belt, wherein said synchronizing wheels are mounted on the other end of the bottom plate in the direction opposite to the servo motor; said separating assembly includes a first parallel clamping cylinder and a second parallel clamping cylinder which are arranged in parallel, and further includes a rotating cylinder connected with said second parallel clamping cylinder, a wire clamping rod connected with one end of said rotating cylinder, a slider cylinder connected with said rotating cylinder, and a wire clamping block connected with one end of said first parallel clamping cylinder, and said first parallel clamping cylinder and said wire clamping block are arranged on one side of said slider cylinder.

The wire separating action of the separating mechanism 51 includes:

the slider cylinder of the T1 ring feeding assembly 51 goes forwards to drive the first parallel clamping cylinder, the second parallel clamping cylinder, the clamping block and the wire clamping rod of the separating assembly 52 to move forwards;

the first parallel clamping cylinder and the second parallel clamping cylinder of the separating assembly 52 move, the clamping block clamps two longest enameled wires, and the wire clamping rod clamps the wound T1 magnetic ring coil;

The slider cylinder of the T1 ring feeding assembly 1 goes backwards to drive the first parallel clamping cylinder, the second parallel clamping cylinder, the clamping block and the wire clamping rod of the separating assembly 52 to move backwards;

The slider cylinder of the separating assembly 52 moves rightwards, and the rotating cylinder rotates clockwise to separate the two longest wires from other six wires;

The servo motor of the T1 ring feeding assembly 51 rotates to drive the whole separating assembly 52 to move rightwards;

The slider cylinder of the T1 ring feeding assembly 51 moves forwards to drive the first parallel clamping cylinder, the second parallel clamping cylinder, the clamping block and the wire clamping rod of the separating assembly 52 to move backwards again and send them into the follow-up process, such as stranding process;

The first parallel clamping cylinder and the second parallel clamping cylinder of the separating assembly are reset and loosened;

the slider cylinder of the T1 ring feeding assembly 51 goes backwards to drive the first parallel clamping cylinder, the second parallel clamping cylinder, the clamping block and the wire clamping rod of the separating assembly 52 to move backwards;

The rotating cylinder of the separating assembly 52 rotates anticlockwise, and the slider cylinder moves leftwards; and The servo motor of the T1 ring feeding assembly 51 rotates to drive the whole separating assembly 52 to move leftwards and back to the null position.

Figure 8:
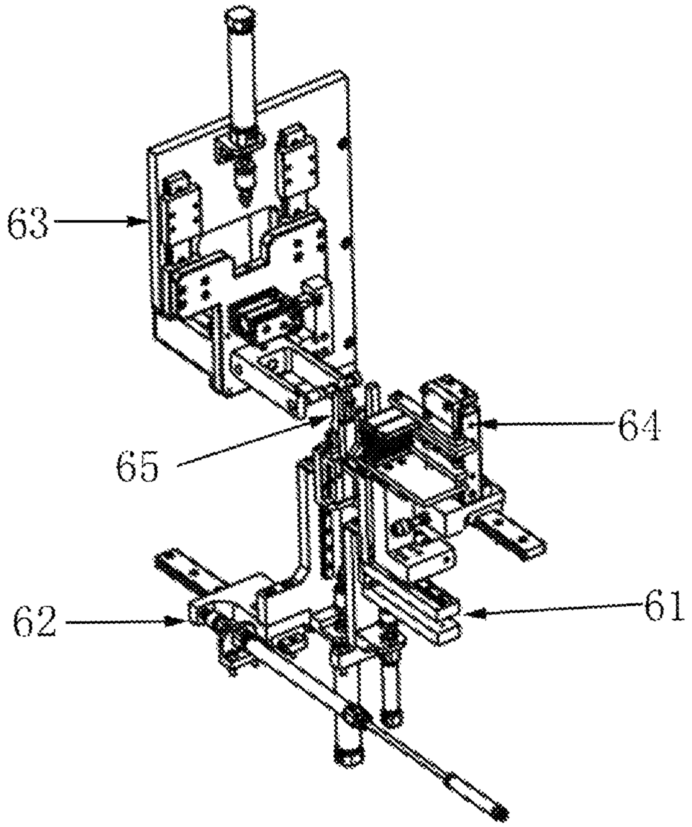
FIG. 8 is a structural representation of a stranding mechanism before T2 ring winding of the full-automatic network transformer winding machine in FIG. 1.

Referring to FIG. 8, said stranding mechanism before T2 ring winding 6 includes a wire tail clamping assembly 61 for clamping the wire tail of wound T1 ring, a wire head clamping assembly 62 for clamping two wire heads to be wound on T2 ring, a T1 ring clamping assembly 65 for clamping T1 ring, a stranding assembly 63 for stranding the wire heads and a carding assembly 64 for keeping the wire heads and the wire tails of wound T1 ring straight, wherein said wire tail clamping assembly 61 is connected with the wire head clamping assembly 62, said carding assembly 64 and said stranding assembly 63 are arranged above said wire tail clamping assembly 61 and said wire head clamping assembly 62.

The stranding mechanism 2 works in the following steps:

The wire tail clamping assembly 61 and the wire head clamping assembly 62 rise simultaneously;

The wire head clamping assembly 61 clamps the wire heads, and the wire tail clamping assembly 62 clamps the wire tails;

The carding assembly 64 falls to clamp the wire tails together with the wire tail clamping assembly 61;

The wire head clamping assembly 62 moves leftwards and the wound T1 ring moves to a certain position;

The stranding assembly 63 loosens and then falls, and clamps the wire heads after it is in place;

The wire tail clamping assembly 61 clamps the wire tails and then moves rightwards, the hair brush of the carding assembly 64 and the hair brush of the wire tail clamping assembly 61 pull the wire tails straight;

The wire head clamping assembly 62 loosens and the falls;

The stranding assembly 63 clamps the wire heads and rotates;

The reclaiming manipulator 10 moves to a reclaiming position and clamps the wire heads and the wire tails; and The stranding assembly 63 loosens and then rises, at the same time the wire tail clamping assembly 61 loosens the wire tails, and then falls, and the carding assembly 64 rises.

Figure 9:
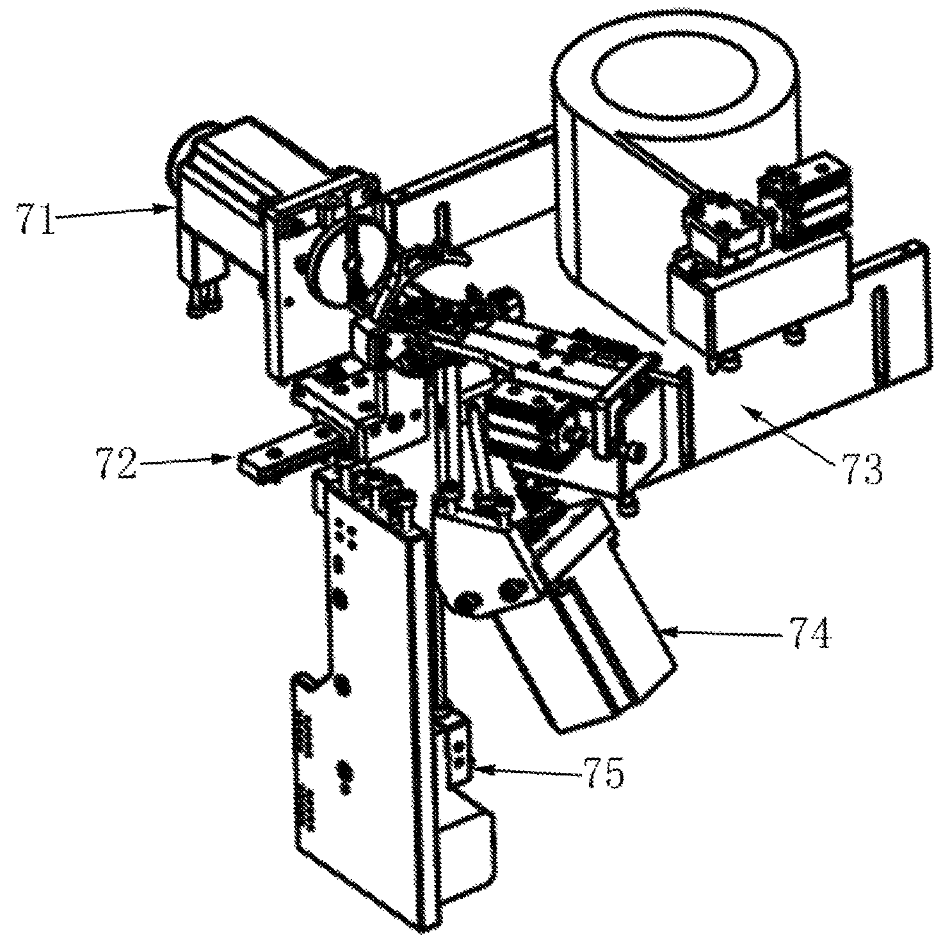
FIG. 9 is a structural representation of a T2 ring winding mechanism of the full-automatic network transformer winding machine in FIG. 1; and in the drawings there are: 1—enameled wire pre-cutting mechanism; 11—base; 12—pre-cutting device; 121—cutter transmission mechanism; 122—cutter; 123—ceramic eyelet; 124—height limiting block; 125—cutter fixing block; 1211—compressed spring; 2—stranding mechanism before T1 ring winding; 201—step motor; 202—wire twisting rotator; 203—polyurethane bearing; 204—cylinder; 205—the first acicular cylinder; 206—the first wire pressing head; 207—pressing ring; 208—the second acicular cylinder; 209—the second wire pressing head; 210—wire supporting post; 211—the first straight guide rail; 3—T1 ring winding mechanism; 301—front inclined reel seat; 302—rear inclined reel seat; 303—wire guide pin; 304—wire guide pin mounting block; 305—the second straight guide rail; 306—wire guide pin locking block; 307—the second cutter; 308—wire outlet cutter seat; 309—cutter protection block; 310—cutter connecting rod; 311—wire outlet opening; 312—wire outlet opening rotating and pulling block; 313—steel ball; 314—spring; 315—pressing plate; 316—optical fiber mounting block; 317—storage reel base; 318—semicircle block of storage reel; 319—winding spacer; 320—semicircle cover of storage reel; 321—front block of storage reel; 322—rear block of storage reel; 323—rear cover of storage reel; 4—tail wire-cutting mechanism; 41—wire tail pressing assembly; 42—vertical pressing assembly; 43—parallel pressing assembly; 44—magnetic ring driving assembly; 45—two-wire separating assembly; 46—transmission mechanism assembly; 47—scrap wire pickup assembly; 5—separating mechanism; 51—T1 ring feeding assembly; 52—separating assembly; 6—stranding mechanism before T2 ring winding; 61—wire tail clamping assembly; 62—wire head clamping assembly; 63—stranding assembly; 64—carding assembly; 65—T1 ring clamping assembly; 7—T2 ring winding mechanism; 71—rotary winding assembly; 72—rotary track assembly; 73—T2 ring clamping device; 74—T2 ring wire arranging assembly; 75—crochet hook lifting assembly; 8—T1 ring winding and transmission mechanism; 9—wire arranging assembly; and 10—reclaiming manipulator.

Referring to FIG. 9, said T2 ring winding mechanism 7 includes a rotary winding device 71, a crochet hook lifting assembly 75 and an enameled wire rotary track assembly 72 connected with said winding mechanism 71, a T2 ring clamping device 73 connected with said enameled wire rotary track assembly 72, and a T2 ring wire arranging assembly 74 connected with said T2 ring clamping device 73, said rotary winding device 71 is used to rapidly wind the wire head wound on T2 ring upwards to above T2 ring, said crochet hook lifting assembly 75 is used to draw the wire at a high speed, said enameled wire rotary track assembly 72 is used to limit movement track of the enameled wire, said T2 ring clamping assembly 73 is used to clamp T2 ring, and said T2 ring wire arranging mechanism 74 is used to allow T2 ring to perform circular motion.

The working process of T2 ring winding mechanism 7 works in the following steps:

the feeding device 4 of the winding machine with T1 and T2 rings puts T2 ring into T2 ring clamping device 73, and T2 ring is clamped by a clamping cylinder;

the feeding device 4 of the winding machine with T1 and T2 rings puts the wire package of T1 ring on T2 ring, and feeds the left wire head into a crochet hook groove;

the cylinder of the enameled wire rotary track assembly 72 retracts, and the wire reel moves toward the rotary winding device 71 and stops after reaching the winding position;

when the crochet hook falls, allows the wire head to go through T2 ring, and continues to fall, the crochet hook carries the wire head to pass through a felt supporting plate and a felt fixing block of the enameled wire rotary track assembly 72, and the wire head is pulled tight through wool on the two parts;

T2 ring arranges the wire, and the motor of the wire arranging device 74 drives T2 ring to rotate at a given angle;

the rotating head of the rotary winding device 71 winds the wire head wound on T2 ring upwards to above T2 ring, and the wire head is sent into the crochet hook groove under the common action of a spring piece, a tension block of the wire reel, a spring and an elastic force regulating ring;

crochet hook falling, wire arranging of T2 ring and turnover action of the rotating head are repeated until a given number of turns is achieved and winding is stopped; and The cylinder of the enameled wire rotary track assembly 72 extends out, the wire reel leaves the rotary winding device, and the wound product is taken out.

The enameled wire pre-cutting mechanism 1 of T1 ring winding device with long and short tail wires cuts a part (usually 30%-70%) of the enameled wire in its diameter direction at each given distance (a length of the enameled wire required for winding a network transformer product), does not cut the whole enameled wire, and the cutting position of each enameled wire is different to obtain tail wires of different length;

the stranding mechanism before T1 ring winding 2 of T1 ring winding device with long and short tail wires twists both ends of the enameled wire into a stranded wire in opposite directions through T1 ring winding device before T1 ring winding;

T1 ring winding mechanism 3 of T1 ring stranding device with long and short tail wires winds one end of the enameled wire of which both ends are twisted onto T1 ring;

One end of the tail wire-cutting mechanism 4 of T1 ring stranding device with long and short tail wires presses the wire head and wire tail of said wound T1 ring, the other end of the tail wire-cutting mechanism 4 clamps the wound T1 ring, and then applies a tensile force outwards, and when the tensile force is greater than the designed tensile cutting force, the stranded wire head is separated from the wound T1 ring at a pre-cutting position;

The separating mechanism 5 of T2 ring winding device separates two longest enameled wires which need to be wound onto T2 ring according to the difference of lengths of tail wires;

The stranding mechanism before T2 ring winding 6 of T2 ring winding device twists two separated wires into stranded wires before winding T2 ring; and Finally, T2 ring winding mechanism 7 of T2 ring winding device winds the stranded wires onto T2 ring.

Full-automatic winding of the network transformer can be realized through these steps of enameled wire feeding, pre-cutting, stranding before T1 ring winding, T1 ring winding, cutting excessive stranded wires, tapping and stranding before T1 ring winding, and finally winding the stranded wire onto T2 ring through T2 ring winding mechanism.

Wherein, a T1 ring pushing assembly is also arranged between the stranding mechanism before T1 ring winding and the winding assembly of said T1 ring winding device with long and short tail wires of the full-automatic network transformer winding machine, and used to pick and place T1 ring.

Wherein, a T1 ring winding and transmission mechanism 8 is also arranged between the stranding mechanism before T1 ring winding and the winding assembly of said T1 ring winding device with long and short tail wires of the full-automatic network transformer winding machine, and used to store some enameled wires which are twisted into a stranded wire and supply the wire to the winding assembly.

Wherein, a wire arranging assembly 9 is also arranged between the winding assembly and the tail wire-cutting mechanism 4 of said T1 ring winding device with long and short tail wires of the full-automatic network transformer winding machine, and used to complete wire arranging action of T1 ring winding to make wire arrangement on T1 ring more uniform.

Wherein, a wound T1 ring pushing assembly is also arranged between the winding assembly and the tail wire-cutting mechanism 4 of said T1 ring winding device with long and short tail wires of the full-automatic network transformer winding machine, and used to push the wound T1 ring to the separating mechanism 5, and push the long and short tail wires of the pushed wound T1 ring to one side of T1 ring and unwind and extend them.

Wherein, a reclaiming manipulator 10 is also arranged between the winding assembly and the tail wire-cutting mechanism 4 of said T1 ring winding device with long and short tail wires of the full-automatic network transformer winding machine, and used to grasp the wound T1 ring and send it to the tail wire-cutting mechanism.

Wherein, said T1 ring winding device with long and short tail wires of the full-automatic network transformer winding machine further includes an automatic NG, which is used to put unsuccessfully wound products into NG bin when said T1 ring winding assembly with long and short tail wires winds unsuccessfully.

Wherein, density of the stranded enameled wires stranded on T1 ring by T2 stranding mechanism of said T1 ring winding device with long and short tail wires depends on operation instruction.

Wherein, a feeding mechanism is also arranged between the stranding mechanism before T2 ring winding 6 and T2 ring winding mechanism 7 of said T2 ring winding device, and used to place T2 ring and the wound T1 ring onto T2 ring winding device.

It should be understood that the forgoing is only preferred examples of the invention, and could not limit patent scope of the invention for this reason, and all changes of equivalent structures or equivalent flows made by utilizing the specification and drawings of the invention, and applied to other related technical fields directly or indirectly, are included within the protection scope of the invention.

The invention claimed is:

1. A full-automatic network transformer winding machine, characterized by including a T1 ring winding device and a T2 ring winding device connected with said T1 ring winding device, wherein said T1 ring winding device includes an enameled wire pre-cutting mechanism, a stranding mechanism before T1 ring winding, a T1 ring winding mechanism and a tail wire-cutting mechanism which are connected with one another sequentially, and said T2 ring winding device includes a separating mechanism, a stranding mechanism before T2 ring winding and a T2 ring winding mechanism which are connected with one another sequentially.

2. The full-automatic network transformer winding machine according to claim 1, characterized in that, said enameled wire pre-cutting mechanism includes a base, multiple pre-cutting devices arranged at different positions on said base, wherein said pre-cutting devices are used for pre-cutting a part of an enameled wire.

3. The full-automatic network transformer winding machine according to claim 1, characterized in that, said tail wire-cutting mechanism includes a rack, a wire tail pressing assembly, a magnetic ring driving assembly and a magnetic ring clamping assembly mounted on the rack.

4. The full-automatic network transformer winding machine according to claim 1, characterized in that, said separating mechanism includes a guide rail, a T1 ring feeding assembly mounted on the guide rail and a separating assembly, and said separating assembly is mounted on said T1 ring feeding assembly.

5. The full-automatic network transformer winding machine according to claim 1, characterized in that, said stranding mechanism before T2 ring winding includes a wire head clamping assembly, a wire tail clamping assembly, a T1 ring clamping assembly and a stranding assembly, wherein said T1 ring clamping assembly is located between the wire tail clamping assembly and the wire head clamping assembly, and said stranding assembly is arranged above the wire head clamping assembly.

6. The full-automatic network transformer winding machine according to claim 1, characterized by further comprising a feeding mechanism, wherein said feeding mechanism includes a T1 coil feeding rack, a transmission device, a T1 coil feeding and lifting device, a left wire clamping and forward-backward moving device, a right wire clamping and forward-backward moving device and a T2 ring feeding device, wherein said T2 ring feeding device includes a T2 ring drawing and lifting device and a T2 ring separation device.

7. The full-automatic network transformer winding machine according to claim 1, characterized in that, said T2 ring winding mechanism includes a winding assembly, a crochet hook lifting assembly and an enameled wire rotary track assembly connected with said winding assembly, a T2 ring clamping mechanism connected with said enameled wire rotary track assembly and a T2 ring wire arranging assembly connected with said T2 ring clamping mechanism.

* * * * *